(12) United States Patent
McKinley et al.

(10) Patent No.: US 8,245,390 B2
(45) Date of Patent: Aug. 21, 2012

(54) METHOD OF MAKING A WIRING BOARD HAVING AN ENGINEERED METALLIZATION LAYER

(75) Inventors: William S. McKinley, Clermont, FL (US); Steve T. Nicholas, Groveland, FL (US); Jeffery A. Dean, Clermont, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 914 days.

(21) Appl. No.: 11/935,994

(22) Filed: Nov. 6, 2007

(65) Prior Publication Data
US 2009/0113705 A1 May 7, 2009

(51) Int. Cl.
*H05K 3/02* (2006.01)
*H05K 3/10* (2006.01)

(52) U.S. Cl. .................. 29/846; 29/830; 29/831

(58) Field of Classification Search ............. 29/846, 29/830–832, 852; 361/718, 719, 748, 761, 361/767
See application file for complete search history.

(56) References Cited

U.S. PATENT DOCUMENTS

| 6,200,407 B1 * | 3/2001 | Wieloch et al. | 156/252 |
| 6,303,881 B1 * | 10/2001 | Parker et al. | 174/264 |
| 7,786,486 B2 * | 8/2010 | Casey et al. | 257/76 |

* cited by examiner

*Primary Examiner* — Thiem Phan
(74) *Attorney, Agent, or Firm* — Birch, Stewart, Kolasch & Birch, LLP (57) ABSTRACT

The present invention relates to a method of manufacturing a printed wiring board (PWB) of the type depicted in FIG. 1. Such a PWB comprises a first substrate and alternating layers of a second substrate and a metal layer. The layer 2 metallization of the PWB is a thick layer of a composite engineered metal material having a configurable coefficient of thermal expansion (CTE) to provide CTE matching with respect to radio frequency (RF) components mounted on the PWB, and having substantial heat dissipation properties to dissipate heat generated by the RF components. This composite metal layer also provides a ground plane for the RF components.

23 Claims, 5 Drawing Sheets

METHOD OF MAKING A WIRING BOARD HAVING AN ENGINEERED METALLIZATION LAYER

BACKGROUND OF THE INVENTION

1. Field of the Invention

The present invention relates generally to printed wiring boards (PWBs) and, more particularly, to methods and apparatuses that enable coefficient of thermal expansion (CTE) matching and heat dissipation for integrated circuit (IC) components attached to PWBs.

2. Description of Related Art

Currently, microelectronic modules and module sub-assemblies typically require that the heat-generating integrated circuit (IC) components of the module be mounted on thermal vias in the printed wiring board (PWB) or on external module housings to effectively remove heat from the module and allow it to operate properly and effectively.

While this approach of separating the heat-generating ICs from the other components of the module is a valid solution, the two approaches of thermal vias and module housings both have serious drawbacks. The use of a module housing to mount heat-generating components increases the cost and manufacturing time for the module. There is the expense of machining the module housing, and also of all the additional wiring and work required to connect the heat-generating components to the other parts of the module.

The use of thermal vias, while eliminating the need for a module housing and reducing the amount of additional wiring and work required to connect all the module components, introduce serious reliability problems because of the coefficient of thermal expansion (CTE) mismatch that occurs when heat-generating components are mounted on a layer of Copper or other ductile metal for effective heat dissipation. Because of the mismatch in CTE between the component and the metal layer, the reliability and usable life of the module is reduced.

Current technology does not have a ready solution for the combined problems of CTE matching and heat dissipation. While several attempts have been made to include layers in a PWB that will allow the board to have a tailorable CTE that can be matched to the components mounted on it, such as altering the chemistry of the dielectric materials or using specially formulated pregs, they consider the issue of the CTE of the whole board, and do not address the potentially disparate needs of individual board components. To this end, the CTE matching technologies available for PWB manufacture today reside mainly in the substrate and bonding layers of a PWB and do not address the ability to mount components to a metallization layer. Also, none of these approaches have dealt with the issue of heat dissipation. Even in a PWB that is CTE matched to the heat-generating components, there is still a need for a heat sink and a method for drawing the heat away from the components and into the sink.

This is especially problematic for radio-frequency (RF) applications. High-frequency components such as microwave circuits not only generate a great deal of heat, but also need to be mounted on a metal surface so that they have an RF ground. None of the available CTE matching solutions are viable for RF components because all of the CTE-matching materials currently used in PWBs are meant for bonding or dielectric layers, and cannot be put in direct contact with the RF components without a significant loss of performance. Further, several of the known methods for accomplishing CTE matching in a PWB entail altering the chemistry of the dielectric materials themselves, leading to further potential degradations in frequency performance.

SUMMARY OF THE INVENTION

Aspects of the present invention are directed at solving the problems of how to best remove heat from wiring boards and improve reliability in a cost-effective and time-efficient fashion. Aspects of the invention pertain to production of PWBs that contain a relatively thick layer of engineered material which provides coefficient of thermal expansion (CTE) matching for components mounted on the board, a mounting surface for heat-generating IC components and improved thermal dissipation capabilities that reduce the need for thermal vias, expensive component housings and the attendant issues of connecting the components. Aspects of the present invention are directed at solving the problems of accomplishing CTE matching without degrading frequency performance of RF components.

Recently, advances in metallurgy and materials engineering have led to the creation of metals and metallic materials that can be tailored to have specific CTEs and thermal properties. It has been discovered that the inclusion of a thick layer of such an engineered material as the layer 2 metallization of a PWB will allow for the attachment of heat-generating components to this metallization layer. The combination of a tailorable CTE and good heat dissipation provides an elegant solution to the problems usually encountered in mounting heat-generating components to a PWB.

Unlike prior attempts at CTE matching, the inventive processes include the use of a thick layer of engineered material to enable the combination of mounting of heat-generating components, customizable CTE matching, and good thermal dissipation into one layer of a PWB. This is a novel use of an existing material to combine three previously disparate features into one cost-effective, easily produced solution.

In looking for a suitable material for the PWB layer that would allow for hot component surface mount and CTE match, it was determined that an increase in the thickness of such a CTE matched substrate would provide effective heat dissipation without the need for thermal vias or expensive metal housings.

The inclusion of an engineered metal into the PWB manufacturing process may entail minor changes to the manufacturing process but offers significant cost savings over the existing alternatives for CTE match and heat dissipation.

One difference in manufacturing is a result of the electrically conductive nature of the engineered material.

Before including the engineered material in the PWB stack, the areas where electrically isolated (non-ground) vias are intended must be identified. Electrically isolated vias may be necessary where connections between circuit pathways on different PWB layers are desired or where specific components on the PWB may need to be directly connected to elements not on the PWB.

Because of its thickness, the CTE-matching material is not etched like a typical Cu metallization layer, oversized holes may be drilled through the material at the points where the electrically isolated vias are intended. These holes may then be filled with a non-conductive epoxy so that when the electrical via holes are drilled and plated through on the assembled PWB, the plating will not come in contact with the CTE-matching layer.

If the engineered material selected for use is not electrically conductive, the steps of pre-drilling and epoxy filling are not necessary. A non-conductive material may be desirable in situations where an RF ground is not necessary or where all the components are SMDs. Preferred embodiments, however, accommodate RF components and using the engineered material as the ground plane for such RF components provides a distinct advantage.

Once the PWB is complete, embodiments of the invention may then call for LASER ablated cavities in the PWB to expose the CTE-matching layer so that heat-generating components can be mounted directly to the CTE-matching layer.

Advantages of the present invention include the ability to control both the in-plane CTE and the thermal dissipation properties of a PWB while using existing manufacturing and processing techniques and technologies to create this new type of PWB. Using a material capable of metal-like heat dissipation without a metal-like CTE allows for significant increases in the thickness of a PWB metal layer without the introduction of additional mechanical stresses. The fact that such a material is available in an electrically conductive embodiment provides the further advantage of acting as a ground plane for RF applications, meaning that RF components, which typically generate a great deal of heat, can be mounted to the CTE-matching layer of the PWB for a combined benefit of CTE matching, heat dissipation, and RF ground.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will become more fully understood from the detailed description given hereinbelow and the accompanying drawings which are given by way of illustration only, and thus are not limitative of the present invention, and wherein FIG. 1a. Is a cross-sectional diagram according to aspects of the invention showing the inventive PWB structure and a relative position of the CTE-matching layer.

The drawings will be described in detail in the course of the detailed description of the invention.

DETAILED DESCRIPTION OF THE INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

The scenario outlined in the description of the related art may be better appreciated with the understanding that both die-form and surface mount device (SMD) packages for heat-generating ICs may require an in-plane CTE as low as 7 to 10 ppm/C and a heat sink with thermal conductivity of 300 to 400 W/mK or better. The CTE of Copper is 17 ppm/C, meaning that attaching an RF component directly to copper will likely cause either the solder joint or the package or the chip itself to crack from the repeated mechanical stresses of constant expansion and contraction.

Although the thermal conductivity of Copper is ~400 W/mK, this is not helpful because the typical thickness of metal layers in a PWB is ~1 mil. Having a thicker layer of metal would improve heat dissipation, but it would also increase the mechanical stresses caused by the CTE mismatch that exists between the metal and the IC components as well as between the metal and non-metal layers of the PWB.

Recent advances in metallurgy and composite materials have resulted in the creation of engineered substances that have the electric and thermal properties of metals while exhibiting a CTE that can be tailored, based on their specific material composition, to be less than 10 ppm/C. The use of such materials in constructing new types of PWBs that are better suited to hold RF and other heat-generating components should be evaluated from a standpoint of using existing manufacturing technologies wherever possible, so that maximum advantage can be gained from the innovative use of the material while also providing cost savings over current module production practices.

The ability to combine in-plane CTE control and effective heat dissipation into a single layer of a printed wiring board (PWB) is made possible by the use of a relatively thick layer of engineered material as the layer 2 metallization of the PWB.

A primary aim of controlling the CTE of the layer 2 metallization is to provide a thermally dissipative surface for heat-generating IC components that is free from the usual mechanical stresses associated with the expansion and contraction of metal.

Because thermal conductivity is a function of thickness as well as surface area, it is important that the CTE-matching layer have a thickness sufficient to allow for heat dissipation without requiring the use of thermal vias or a module housing. The thickness of the CTE-matching layer is determined primarily by the heat dissipation requirements of the particular module being assembled and the thermal conductivity of the material used for the CTE-matching layer. This is further moderated by concerns for the overall thickness of the resultant PWB due to potential pre-existing size requirements, and the need to plate electrical via holes, which have a minimum height to diameter aspect ratio of 5:1.

One inventive embodiment uses a Copper-Graphite composite material as the CTE-matching layer for a RADAR transceiver module. In this embodiment, it was also desirable that the engineered material be metal so that in addition to CTE matching and heat dissipation, it provided an RF ground for microwave ICs mounted to its surface. Portions of the CTE-matching layer used for surface mounting may be exposed by LASER ablation of the uppermost dielectric material in this embodiment.

Other inventive embodiments may use different materials such as metallized ceramics depending on the specific CTE, thermal conductivity, and frequency performance desired. For applications that do not require frequency performance, the CTE-matching layer may not require any metal. The CTE-matching layers of these embodiments may also be exposed for surface applications by LASER ablation, or may use alternative techniques such as mechanical abrasion or etching.

The specific properties of interest of the Copper-Graphite material are its CTE of 7 ppm/C and thermal conductivity of 400 W/mK. Given the amount of heat generated from the components of an RF transceiver module, the appropriate thickness for the composite material was determined to be 40 mils, compared to the typical metallization layer in currently produced PWBs, which uses 1 oz. of Cu, for a thickness of ~1 mil.

Figure 1A:
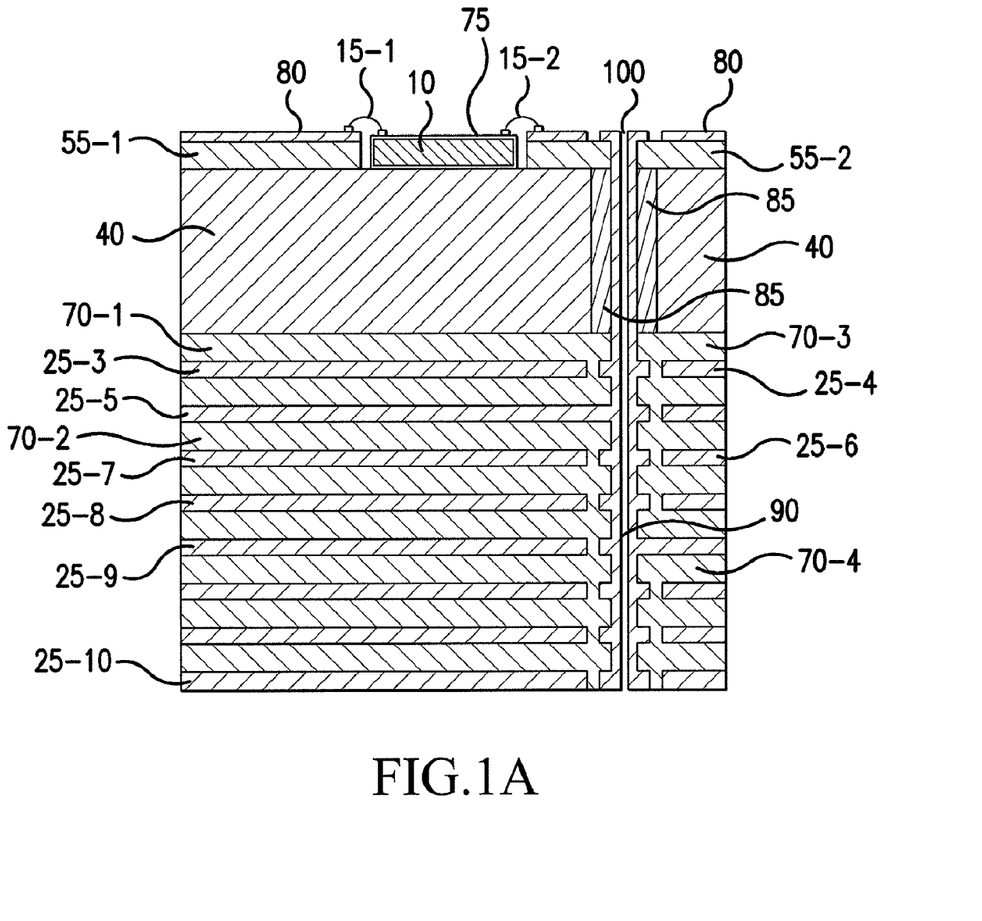

One property useful in embodiments of the inventive method is compatibility with copper or palladium plating and industry-standard PWB fabrication processes. The ability to introduce the CTE-matching material into existing and widely used manufacturing processes is essential to material and cost saving PWB embodiments of the type disclosed herein, FIG. 1a shows a cross-section of PWB created in the composite material embodiment of the inventive process. Heat-generating RF components 10 are attached to the PWB by means of eutectic solder in cavities 75 where the top substrate layer 55 of the PWB has been LASER ablated to expose the composite material comprising the layer 2 metallization 40 of the PWB. The RF components 10 are then connected to the top-layer metallization 80. In this embodiment, that connection is accomplished by using conventional wire-bonds 15 such as Thermosonic Gold wire. Alternative means of attaching and connecting the heat-generating RF components may include conductive epoxy and wedge bonding, respectively. The manufacturing process resulting in the structure of FIG. 1a is discussed below.

FIGS. 2a-e discuss the PWB stack-up process whereby the composite material layer is added to this embodiment of the inventive process. Typically, PWBs are constructed of material cores (foil/dielectric/foil) that are laminated together using pregs (a dielectric glue to hold the cores together to form a core stackup). The processes for creating and laminating material cores together are known to individuals with ordinary skill in the art of PWB manufacture. The top layer of a PWB created according to an embodiment of the inventive method would be a one-sided dielectric core (foil/dielectric) attached to the CTE-matching layer using a preg. An alternative embodiment may allow for simply covering the CTE-matching layer with a preg to prevent unwanted electrical contact with the CTE-matching layer. The techniques of using one-sided material cores and pregs in this fashion are also known to individuals with ordinary skill in the art of PWB manufacture.

Figure 2A:
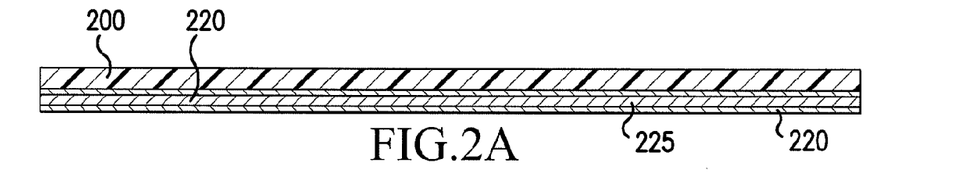
FIGS. 2a-e are process diagrams illustrating a method of manufacturing a PWB according to the invention.

FIG. 2a begins with a PWB stack of Cu metallization 220 and an FR4 substrate. 225. Alternative embodiments of the inventive method may use a substrate 225 comprised of various materials including ceramics, phenol based resin, Teflon, or fiberglass. Alternative embodiments of the inventive method may also use an exotic metal such as palladium instead of copper, but this would greatly increase the cost of production. This portion of the stack is fabricated in a first lamination cycle according to lamination techniques known to individuals with ordinary skill in the art of PWB manufacture.

The topmost layer of substrate 200 is a high-performance laminate chosen, in this embodiment of the inventive method, for its low loss high frequency dielectric properties. In other embodiments of the invention not meant for high frequency applications, an epoxy resin bonded glass fabric, such as the one known as FR-4, or any other possible lower-layer substrate could also be used as the topmost layer of substrate 200. Further, different frequency requirements could also necessitate the use of high performance laminates in the lower substrate layers 225 of the PWB in alternative inventive embodiments.

After the first lamination cycle, the top core, the CTE-matching material, and a binding preg to attach the CTE-matching material to the rest of the PWB are laminated with the first lamination set to form a completed PWB.

Figure 2B:
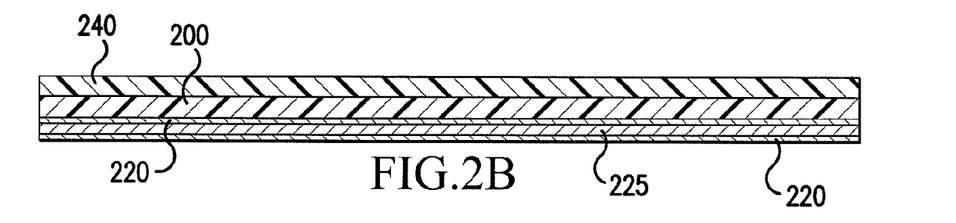
Figure 2C:
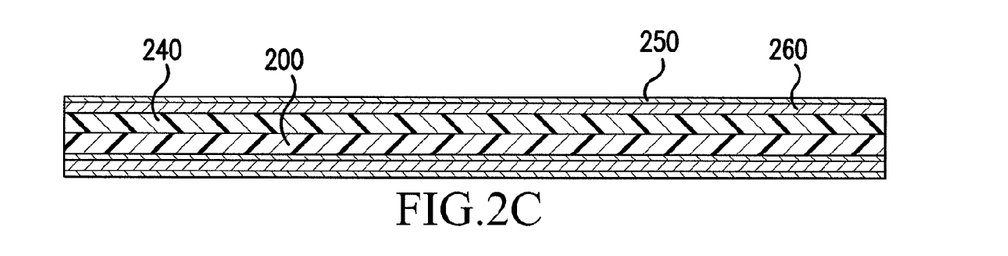

FIG. 2b Demonstrates the addition of the composite material. Once the lower lam set has been established/constructed, a preg layer, the predrilled and back filled CTE-matching material, and the top dielectric and foil (in foiled preg form) are added to the stack to form the final lamination set as depicted in FIG. 2c.

Figure 2D:
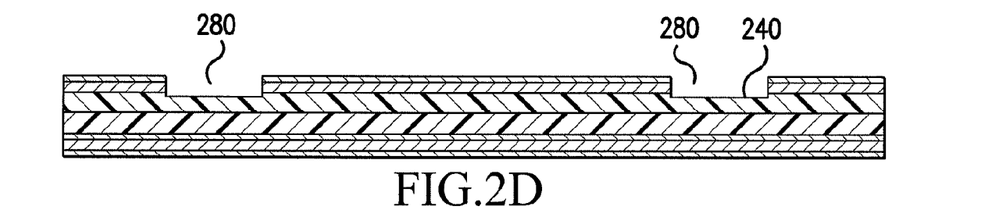
Figure 2E:
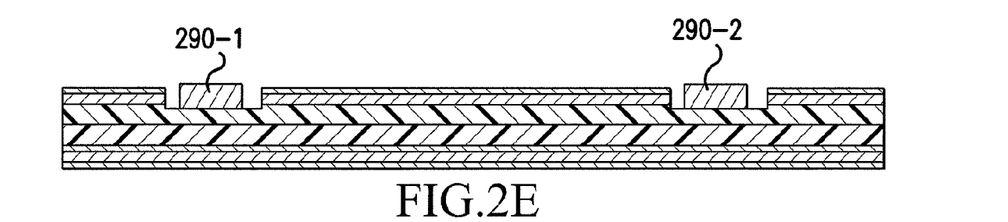

FIG. 2d shows a cross-section of the complete PWB stack created by this embodiment of the inventive process and demonstrates the creation of the ablated cavities 280, which can be accomplished by a variety of methods including LASER ablation and mechanical cutting with a controlled depth router bit. These cavities expose the layer 2 metallization 240 for attachment of heat-generating parts 290-1 such as RF components 290-2 by means of epoxy attachment, soldering, or pressure-mountings depicted in FIG. 2e.

Because this embodiment uses a metal as the layer 2 metallization, locations where electrically isolated vias are intended in the PWB must be identified before the CTE-matching layer can be inserted into the PWB stack.

The CTE-matching layer 40, because it cannot readily or easily be etched due to its thickness, may have holes drilled into it where the electrically isolated vias 100 are intended. These holes should be larger in diameter than the size of the intended via holes. The holes may be created by a variety of methods including mechanical or LASER drilling, they are then back-filled with an electrically non-conductive epoxy 85. Once the via holes are drilled through the PWB they are coated with electrically conductive material 90 by plating Copper along the inside the holes. The conductive material may also be introduced into the electrically isolated via hole by filling it with a conductive paste or other conductive material (such as solid silver) after the entire board stack is laminated. Because electrically isolated via 100 is drilled through the epoxy 85, the conductive material 90 lining the via hole 100 will remain electrically isolated from the metal in the CTE-matching layer 40.

FIGS. 3a-d illustrate the drilling and epoxy-filling aspects of including a metal CTE-matching layer into a PWB where an electrically isolated via is intended. In this example, the CTE-matching material is assumed to be electrically conductive. Non-conductive embodiments of the CTE-matching material are not subjected to the drilling and epoxy-filling steps of the inventive process.

Figure 3A:
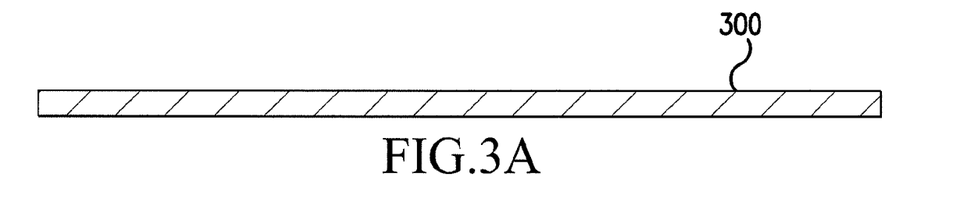
FIGS. 3a-d are another set of process diagrams illustrating a method of manufacturing a PWB according to the invention.

FIG. 3a starts with a cross-section of the CTE-matching material 300 machined to the desired shape and thickness.

Figure 3B:
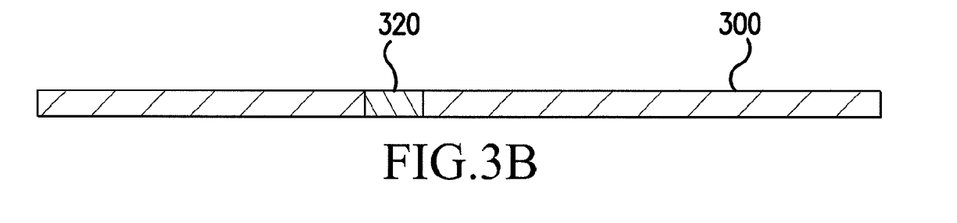

FIG. 3b illustrates a cross-section of the CTE-matching material 300 after it has the appropriate holes created in it by, in this embodiment, mechanical drilling. Holes of this type may be created in the CTE-matching layer by a variety of methods including mechanical or LASER drilling. After they are created, the holes are then filled with a non-conductive epoxy 320 and the epoxy is allowed to dry. The drying and curing procedures and times vary depending on the type of epoxy used but will usually involve a thermal cycle with outgassing.

Figure 3C:
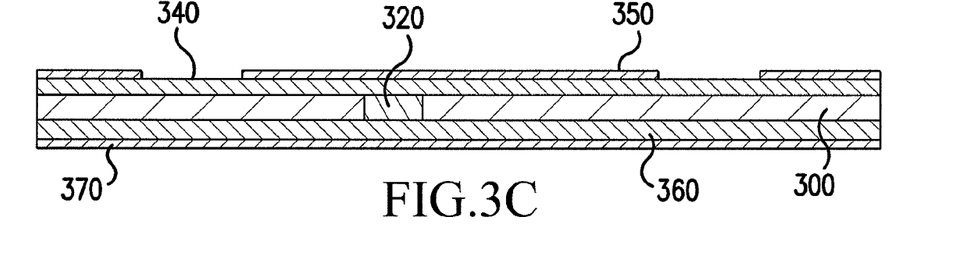

FIG. 3c illustrates a cross-section of an embodiment of a PWB stack based on the inventive process. The CTE-matching layer 300, containing an epoxy-filled hole 320 is the layer-2 metallization of the PWB stack in this embodiment. The dielectric layer 340 and lower substrate layer 360 separate the CTE-matching layer 300 from the top layer metallization 350 and the lower layer metallization 370.

Figure 3D:
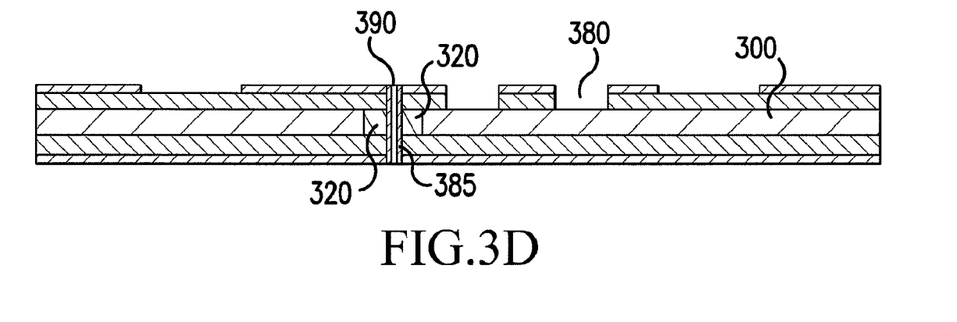

FIG. 3d illustrates a cross-section of an embodiment of a completed PWB stack based on the inventive process. An electrically isolated via 390 has been created by drilling into the PWB stack in the location where the epoxy-filled hole 320 was created in the CTE-matching layer 300.

After the via hole is created in the PWB, in this embodiment it is plated with copper 385 so that it will electrically connect the top and bottom metallization layers. Other methods of introducing conductive material into an electrical via hole include filling the hole with metallic paste, plating it solid with copper, or back-filling it with silver.

FIG. 3d also illustrates the ablated cavities 380 that are created to allow components to be mounted directly onto the CTE-matching layer 300. In this embodiment of the inventive process, the cavities were created through LASER ablation. Other methods for creating cavities where the CTE-matching layer is exposed for attaching components to it include mechanical routing.

FIG. 1a illustrates the ablated cavities 75 in more detail. In this cross-sectional view, it is more clearly illustrated that the top metallization layer 25 and the dielectric layer 55 are both ablated away to create the cavities where components may then be attached to the CTE-matching layer. In this embodiment of the inventive process, a PWB for RF applications is being created. The dielectric layer 55 in this embodiment is made of a high-performance laminate chosen specifically for its dielectric properties whereas the lower substrate layers 70 may be made from less expensive material such as an epoxy resin bonded glass fabric (ERBGF) like FR-4, synthetic resin bonded paper (SRBP), ceramic, or Teflon. In other embodiments of the inventive process, there may be no need for a specific dielectric layer 55 and all the non-metal layers may be substrate layers 70.

Figure 4A:
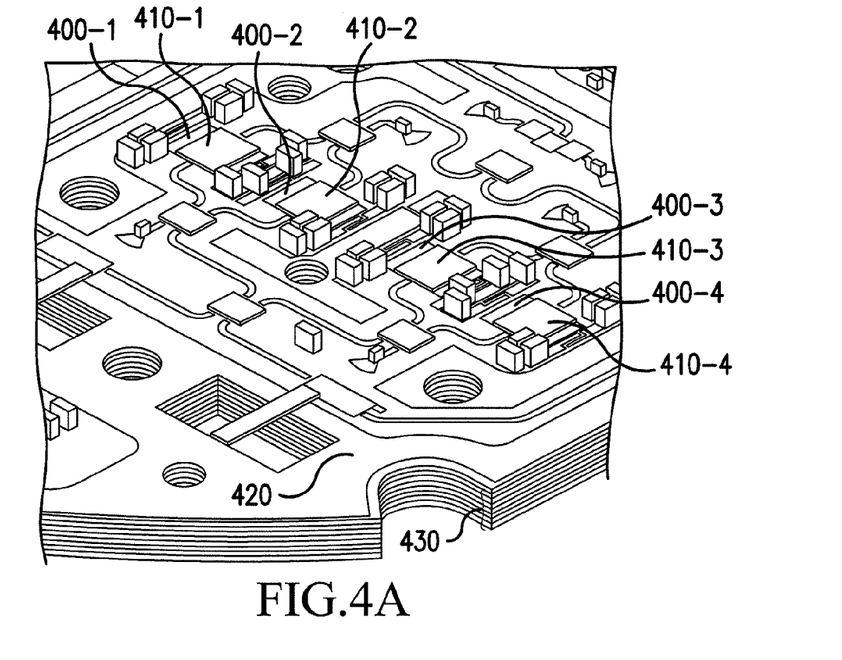
FIGS. 4a-b compare a typical PWB to one manufactured according to an embodiment of the inventive process.
Figure 4B:
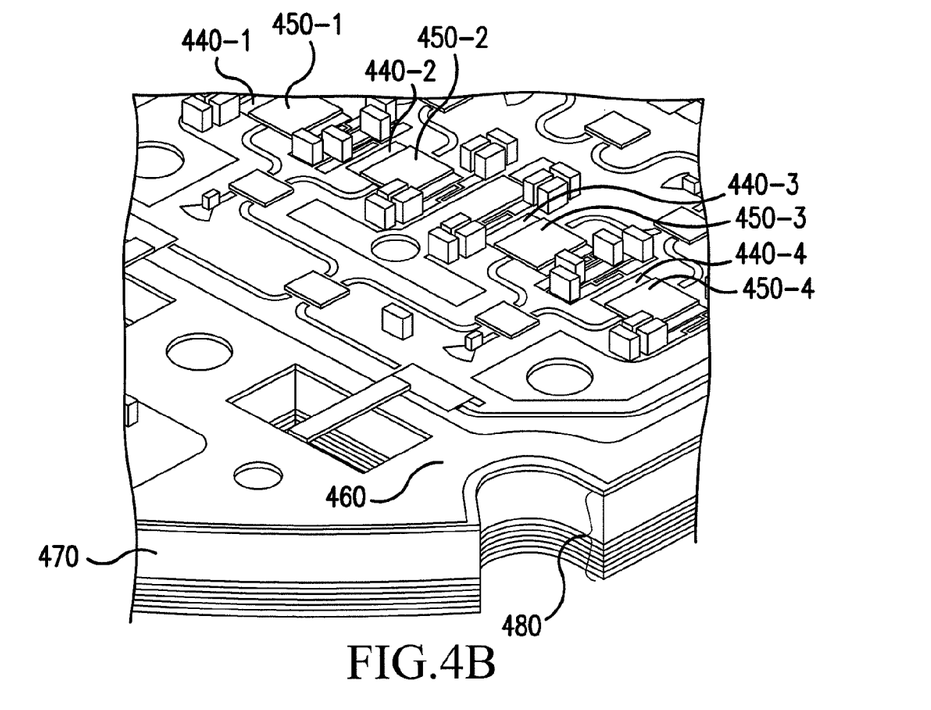

FIGS. 4a-b present a comparison of two PWBs. FIG. 4a is a PWB produced according to current processes and technologies while FIG. 4b is a PWB produced according to an embodiment of the inventive process.

Figure 1B:
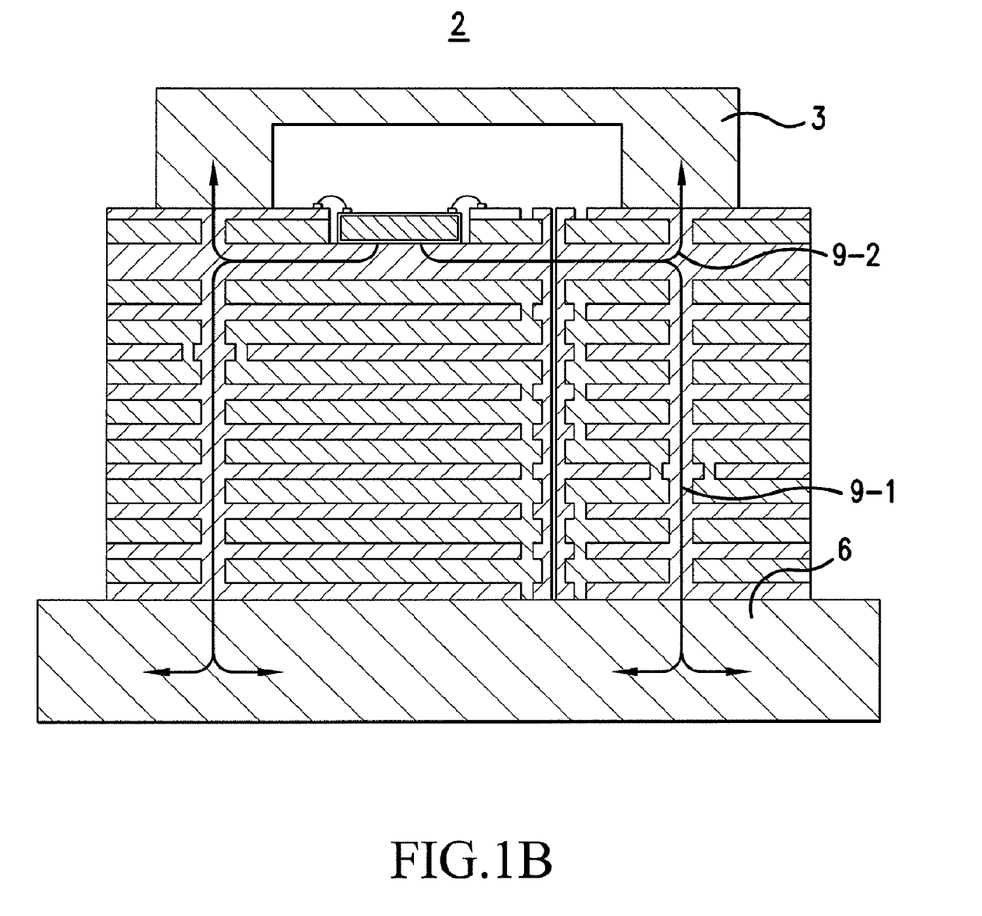
FIG. 1b Is a cross-sectional diagram of a PWB without a CTE-matching layer and with external heat sinks and thermal vias.

In FIG. 4a, the PWB stack 430 illustrated is one intended for RF applications. The layer 2 metallization 400 has been exposed by ablating away regions of the top metallization and dielectric layers 420. RF components 410 are attached directly to the layer 2 metallization 400 for purposes of RF grounding. The layer 2 metallization 400 is Copper and is between 0.7 and 1.4 mils thick, like all the metallization layers in the PWB. It does not provide any CTE matching or heat dissipation for the RF components, resulting in a reduced operating lifetime and creating a need for external heat sinks. FIG. 1b depicts a PWB without a CTE-matching layer and with a top heat sink 3 and a bottom heat sink 6 and thermal vias 9 to channel heat up 9-2 to the top heat sink 3 and down 9-3 to the bottom heat sink.

In FIG. 4b, the PWB stack 480 illustrated is also one intended for RF applications. This PWB, however, was created according to an embodiment of the inventive process. Here, the layer 2 metallization 440 has also been exposed by ablating away regions of the top metallization and dielectric layers 460. In this embodiment, however, the exposed layer 2 metallization 440 is the CTE-matching layer 470. The CTE-matching layer 470 introduced into the PWB in this embodiment of the inventive process is a Copper-Graphite composite material and is 40 mils thick. It provides a ground plane for the RF components 450 that are attached directly to it and also matches the CTE of the RF components. Further, because of its thickness, it is capable of not only spreading, but also dissipating the heat generated by the attached RF components 450, eliminating the need for thermal vias and external heat sinks.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

We claim:

1. A method of manufacturing a printed wiring board (PWB), comprising:
   providing a first substrate;
   providing at least two alternating layers of a second substrate and a metal layer;
   providing, as a layer 2 metallization of the PWB, a CTE-matching layer of an engineered material having a configurable coefficient of thermal expansion (CTE) to provide substantial CTE matching with respect to the first substrate and a non-metal PWB layer or component to be mounted to the CTE matching layer;
   drilling holes in the CTE-matching layer where electrically isolated vias are intended, said holes having a diameter larger than that of the intended electrically isolated vias; and
   filling said holes with non-conductive epoxy so that when the holes for the electrically isolated vias are drilled and plated through on the PWB, they will be electrically isolated from the CTE-matching layer by the remaining epoxy.

2. The method of claim 1, said CTE-matching layer having substantial heat dissipation properties.

3. The method of claim 2, said CTE-matching layer having a thickness sufficient to substantially dissipate heat.

4. The method of claim 2, said CTE-matching layer having a thermal conductivity between 200 and 500 W/mK.

5. The method of claim 1, said CTE-matching layer being capable of receiving heat-generating integrated circuit (IC) components.

6. The method of claim 1, said CTE-matching layer having a CTE in a range of 0 ppm/C to 10 ppm/C.

7. The method of claim 1, said CTE-matching layer being substantially conductive.

8. The method of claim 1, where said step of drilling holes in the CTE-matching layer is performed before the CTE-matching layer is added to the PWB stack.

9. The method of claim 8, said providing step including inserting the drilled CTE-matching layer into the PWB stack.

10. The method of claim 1, wherein said CTE-matching layer is a ground plane.

11. The method of claim 1, further comprising the step of: attaching heat generating components to said PWB.

12. The method of claim 11, said attaching heat generating components to said PWB via solder attachment, pressure attachment, and/or epoxy attachment.

13. The method of claim 11, said heat generating components being RF components.

14. The method of claim 1, said CTE-matching layer having a thickness of more than 1.4 mils.

15. The method of claim 1, said CTE-matching layer having a CTE of 7 ppm/C.

16. The method of claim 1, said CTE-matching layer having a thickness of 40 mils.

17. The method of claim 1, said CTE-matching layer having a thermal conductivity of 300 W/mK.

18. The method of claim 1, further comprising the steps of:
   attaching surface mounted device (SMD) components to the PWB;
   ablating away specific sections of PWB layers above the CTE-matching layer;

attaching heat generating components to the CTE-matching layer in the ablated sections;

connecting the attached components to other components on the PWB.

19. The method of claim 18, said attaching step comprising attaching RF components to said CTE-matching layer.

20. The method of claim 18, wherein said CTE-matching layer is a ground plane for the RF components.

21. The method of claim 18, said CTE-matching layer having a CTE matched to said attached heat generating components.

22. The method of claim 18, said CTE-matching layer providing substantial heat dissipation.

23. The method of claim 1, where the engineered material includes a metal-graphite composite.

* * * * *